(12) United States Patent
Tanaka (10) Patent No.: US 11,042,058 B2
(45) Date of Patent: Jun. 22, 2021

(54) IMAGE DISPLAY DEVICE

(71) Applicant: NIPPON KAYAKU KABUSHIKI KAISHA, Tokyo (JP)

(72) Inventor: Kouichi Tanaka, Tokyo (JP)

(73) Assignee: NIPPON KAYAKU KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/550,783

(22) Filed: Aug. 26, 2019

(65) Prior Publication Data

US 2019/0384110 A1    Dec. 19, 2019

Related U.S. Application Data

(63) Continuation of application No. PCT/JP2018/007296, filed on Feb. 27, 2018.

(30) Foreign Application Priority Data

Mar. 3, 2017    (JP) .............................. JP2017-040034

(51) Int. Cl.
*G02F 1/1335* (2006.01)
*H01L 27/32* (2006.01)

(52) U.S. Cl.
CPC .. *G02F 1/133528* (2013.01); *G02F 1/133514* (2013.01); *G02F 1/133553* (2013.01); *H01L 27/322* (2013.01); *H01L 27/3211* (2013.01); *H01L 27/3241* (2013.01)

(58) Field of Classification Search
None
See application file for complete search history.

(56) References Cited

U.S. PATENT DOCUMENTS

| | | | | |
|---|---|---|---|---|
| 5,928,801 | A * | 7/1999 | Broer | G02F 1/13362 428/690 |
| 2004/0051445 | A1 | 3/2004 | Adachi | |
| 2004/0206960 | A1* | 10/2004 | Nishikawa | H01L 51/5284 257/72 |
| 2004/0263736 | A1 | 12/2004 | Graham et al. | |
| 2006/0181662 | A1* | 8/2006 | Kameyama | G02F 1/133528 349/117 |
| 2007/0257609 | A1 | 11/2007 | Fukuda et al. | |

(Continued)

FOREIGN PATENT DOCUMENTS

| CN | 102768433 A | 11/2012 |
|---|---|---|
| CN | 105283783 A | 1/2016 |

(Continued)

OTHER PUBLICATIONS

International Search Report for corresponding International Application No. PCT/JP2018/007296 dated May 29, 2018.

(Continued)

*Primary Examiner* — Evren Seven
(74) *Attorney, Agent, or Firm* — Pearne & Gordon LLP (57) ABSTRACT

An image display device includes a wavelength conversion layer containing quantum dots and a light reflecting layer provided on an observer side with respect to the wavelength conversion layer. The light reflecting layer includes, in a reflection wavelength region, a peak wavelength of a light source that emits excitation light to be used for emission of the quantum dots. The light reflecting layer is a polarizing reflective layer.

9 Claims, 5 Drawing Sheets

(56) References Cited

U.S. PATENT DOCUMENTS

| | | | |
|---|---|---|---|
| 2008/0079855 | A1 | 4/2008 | Komatsu et al. |
| 2012/0050632 | A1 | 3/2012 | Shih |
| 2012/0113672 | A1 | 5/2012 | Dubrow et al. |
| 2016/0085101 | A1 | 3/2016 | Saitoh et al. |
| 2016/0091757 | A1 | 3/2016 | Miki et al. |
| 2016/0300535 | A1 | 10/2016 | Gilbert et al. |
| 2016/0357039 | A1 | 12/2016 | Kim et al. |
| 2017/0271562 | A1* | 9/2017 | Wang ............ H01L 33/56 |
| 2018/0122869 | A1* | 5/2018 | Jiang ............ H01L 27/3211 |
| 2018/0138027 | A1 | 5/2018 | Oku et al. |
| 2018/0175316 | A1* | 6/2018 | Chen ............ H01L 27/32 |
| 2018/0348419 | A1* | 12/2018 | Iida ............ G02F 1/133528 |
| 2019/0080897 | A1 | 3/2019 | Oku et al. |

FOREIGN PATENT DOCUMENTS

| | | |
|---|---|---|
| JP | 2002-090743 A | 3/2002 |
| JP | 2002-179668 A | 6/2002 |
| JP | 2003-315556 A | 11/2003 |
| JP | 2004-029824 A | 1/2004 |
| JP | 2008-304932 A | 12/2008 |
| JP | 2016-062804 A | 4/2016 |
| JP | 2016-070949 A | 5/2016 |
| JP | 6006210 B2 | 10/2016 |
| JP | 2017-016925 A | 1/2017 |
| JP | 2017-021322 A | 1/2017 |
| JP | 2017-037121 A | 2/2017 |
| JP | 2017-045652 A | 3/2017 |
| JP | 6133456 B2 | 5/2017 |
| WO | 2016/017468 A1 | 2/2016 |
| WO | 2017/026118 A1 | 2/2017 |

OTHER PUBLICATIONS

Written Opinion for corresponding International Application No. PCT/JP2018/007296 dated May 29, 2018.

Xie et al.; "Colloidal InP Nanocrystals as Efficient Emitters Covering Blue to Near-Infrared"; Journal of American Chemistry Society; 2007, 129, pp. 15432-15433.

International Preliminary Report on Patentability for corresponding International Application No. PCT/JP2018/007296 dated Sep. 3, 2019.

English translation of Written Opinion for corresponding International Application No. PCT/JP2018/007296 dated May 29, 2018.

Extended European Search Report dated Oct. 29, 2020 for corresponding International Application No. European Application No. 18761445.8.

First Office Action dated Mar. 3, 2021 for corresponding Chinese Application No. 201880013826.8 and English translation.

\* cited by examiner

IMAGE DISPLAY DEVICE

CROSS REFERENCE TO RELATED APPLICATIONS

This is a continuation application of International Patent Application No. PCT/JP2018/007296 filed Feb. 27, 2018, which claims the benefit of Japanese Patent Application No. 2017-040034 filed Mar. 3, 2017, the full contents of all of which are hereby incorporated by reference in their entirety.

BACKGROUND

Technical Field

The present disclosure relates to an image display device, such as a liquid crystal display device (hereinafter also referred to as an "LCD") and an organic electroluminescence (EL) display (hereinafter also referred to as an "OLED"), each using a wavelength conversion layer that contains quantum dots.

Description of the Related Art

The image display devices such as the LCD and the OLED are characterized by low power consumption and space saving, and the uses thereof are being extended year by year to televisions, personal computers, smartphones, car navigation systems, and the like. In many of these image display devices, color filters are mainly used to perform color display.

In recent years, these image display devices have been required to further improve the color reproducibility, and as means for that, a technique of using quantum dots (also referred to as QDs) is attracting attention (for example, see US Patent No. 2012/0113672). It is known that the emission color of the quantum dot varies depending on its particle size. For example, when a member containing quantum dots is irradiated with excitation light from a backlight, the quantum dots are excited and emit fluorescence. At this time, by using quantum dots having different emission properties, the image display device can emit lights with narrow emission wavelength bands such as blue, green, and red to produce white light. Since the emission wavelength bands are narrow in the emission by quantum dots, by appropriately selecting the wavelengths, it is possible to make the obtained white light highly bright and excellent in color reproducibility.

In Japanese Patent Application Publication No. 2017-16925, a backlight and an LCD each using a sheet containing quantum dots are disclosed. In Japanese Patent Application Publication No. 2017-16925, a blue light-emitting diode (LED) is used as a light source, and the sheet containing the quantum dots which is excited by the blue LED and emit green light and red light, respectively, is disposed on a light guide plate.

Further, in Japanese Patent Application Publication No. 2016-70949, a display device is disclosed, which has a color layer formed by combining a color filter and a wavelength conversion layer having quantum dots. Light emitted from a quantum dot is scattered light, and hence, when quantum dots are disposed between polarizing plates, light is leaked to cause a decrease in contrast in a black display. Therefore, in Japanese Patent Application Publication No. 2016-70949, an in-cell polarizer is disposed on the liquid crystal layer side, and the color filter and the wavelength conversion layer are disposed on the more outer side (the observer side) than the in-cell polarizer.

In the case of using the display device as shown in Japanese Patent Application Publication No. 2016-70949 as, for example, a liquid crystal display device, the light of the backlight is used as polarized light, and by control of orientation of liquid crystal molecules in a liquid crystal cell and by control of transmission and absorption of light by the in-cell polarizer, it is possible to display an image where pixels to emit light and pixels not to emit light have been selected. However, the color filter using the quantum dots as thus described simultaneously emit light also by external light (for example, sunlight) containing a wavelength necessary for emission. For example, when the image display device as shown in Japanese Patent Application Publication No. 2016-70949 is observed in a room or the like where the sunlight is incident, the color filter emits light by the sunlight even in a black display, and black luminance is thereby improved. As a result, the contrast decreases and the visibility of the display image deteriorates greatly. Further, this is not limited to the sunlight, but even in the case of indoor illumination, when light with the same wavelength as that of the light source of the backlight (for example, in the case of the blue LED, a peak wavelength during emission is 450 nm) is incident on the color filter, the color filter emits light regardless of the state of the image display, to greatly impair the visibility of the image.

SUMMARY

The present disclosure is related to providing an image display device using quantum dots, capable of achieving a display image excellent in visibility even in an environment with external light.

According to an aspect of the present disclosure, an image display device includes: a wavelength conversion layer containing quantum dots and a light reflecting layer provided on an observer side with respect to the wavelength conversion layer. The light reflecting layer includes, in a reflection wavelength region, a peak wavelength of a light source that emits excitation light to be used for emission of the quantum dots.

Further, it is preferable that the image display device is a liquid crystal display device or an organic EL display.

Further, it is preferable that a polarizing plate is further disposed on the observer side with respect to the wavelength conversion layer.

Further, it is preferable that the wavelength conversion layer contains a first quantum dot that is excited by the excitation light to emit green light, and a second quantum dot that is excited by the excitation light to emit red light.

Further, it is preferable that the peak wavelength of the light source is 350 nm or more and 650 nm or less.

Further, it is preferable that a central reflection wavelength of the light reflecting layer is 350 nm or more and 750 nm or less.

Further, it is preferable that an absolute value of a difference between the central reflection wavelength of the light reflecting layer and the peak wavelength of the light source is 0 nm or more and 70 nm or less.

Further, it is preferable that the light reflecting layer is a polarizing reflective layer.

Further, it is preferable that the polarizing reflective layer is a cholesteric liquid crystal layer.

Further, it is preferable that the light reflecting layer is a cholesteric liquid crystal layer, and a quarter-wave plate is disposed between the cholesteric liquid crystal layer and the polarizing plate.

Further, it is preferable that a phase-difference value of the quarter-wave plate is 90 nm or more and 125 nm or less.

Further, it is preferable that an angle between a slow axis of the quarter-wave plate and a polarization axis of the polarizing plate is 45°.

Further, it is preferable that an anti-reflective layer is further provided on the observer side of the light reflecting layer.

The present disclosure can provide an image display device using quantum dots, capable of achieving a display image excellent in visibility even in an environment with external light. In particular, in the case of using a polarizing reflective layer (hereinafter also referred to as a "reflective polarizer") as a light reflecting layer, the present disclosure has an excellent function to effectively cut external light containing a wavelength of excitation light for the quantum dots, and reflect only external light efficiently while maintaining the brightness of emitted light from the image display device.

DETAILED DESCRIPTION

Hereinafter, each of embodiments, comparative examples, and examples according to the present disclosure will be described with reference to the drawings. The content of the disclosure is only an example, and changes that can be appropriately designed by those skilled in the art are included in the scope of the present disclosure. Further, in order to clarify the description, the drawings are schematically represented in terms of the width, size, thickness, shape, and the like as compared to actual aspects, but this is only an example as well. Moreover, portions of the drawings, which are unnecessary in describing the effect of the present disclosure, are omitted as appropriate, but the omission does not limit the scope of the present disclosure.

An image display device according to the present disclosure is an image display device including a wavelength conversion layer that contains quantum dots, and a light reflecting layer including, in a reflection wavelength region, a peak wavelength of a light source that emits excitation light to be used for the emission of the quantum dots, is provided on the side closer to an observer than the wavelength conversion layer. The image display device is preferably a liquid crystal display device or an organic EL display. The wavelength conversion layer containing the quantum dots is a constituent included in any member constituting an image display device such as a backlight unit or a color filter. It is preferable that the wavelength conversion layer containing the quantum dots be a color filter itself or constitute a part of the color filter. Hereinafter, each embodiment of the image display device will be described in detail.

First Embodiment

Figure 1:
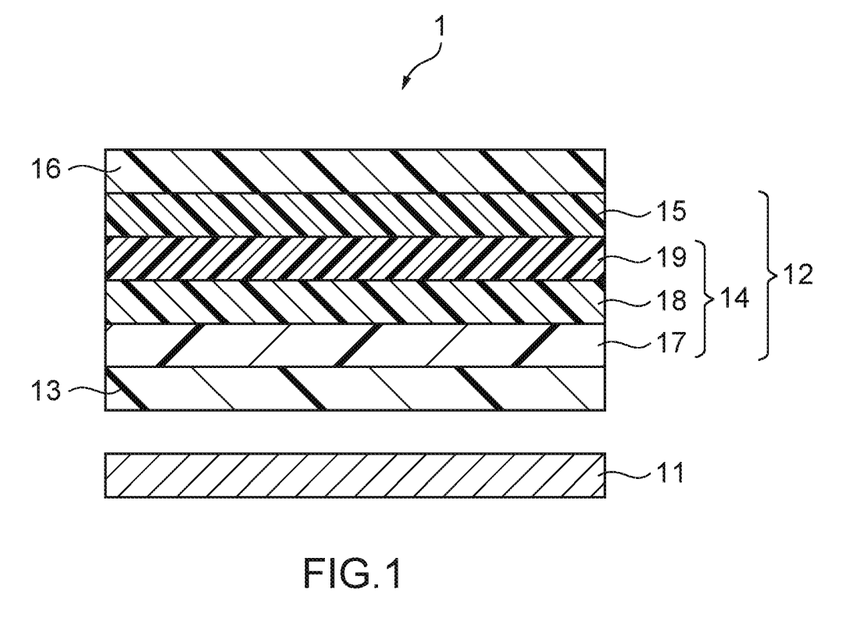
FIG. 1 is a schematic sectional view of a liquid crystal display device that is an example of an image display device according to a first embodiment of the present disclosure.

In a first embodiment, the case of the image display device being a liquid crystal display device (LCD) will be described. The liquid crystal display device according to the first embodiment has a configuration including a light reflecting layer on the observer side of the wavelength conversion layer containing the quantum dots. As shown in FIG. 1, a liquid crystal display device 1 is provided with a backlight unit 11 including a light source that emits excitation light, and a liquid crystal display unit 12 disposed on the backlight unit 11. In the liquid crystal display device 1, the observer observes the liquid crystal display device 1 from the liquid crystal display unit 12 side that is the upper part of FIG. 1. The liquid crystal display unit 12 is disposed on the backlight unit 11 and includes: a backlight-side polarizing plate 13 that converts light from the backlight into polarized light; a display panel 14 disposed on the backlight-side polarizing plate 13; an observer-side polarizing plate 15 disposed on the display panel 14; and a light reflecting layer 16 disposed on the observer-side polarizing plate 15. The observer-side polarizing plate 15 may not necessarily be disposed, but by using the observer-side polarizing plate 15, the contrast of an image can further be improved, and external light having been unable to be absorbed in the light reflecting layer 16 can be absorbed to further enhance external-light cutting efficiency. The display panel 14 includes a counter substrate 17, a liquid crystal layer 18 disposed on the counter substrate 17, and an array substrate 19 disposed on the liquid crystal layer 18. The counter substrate 17 includes an alignment film, a columnar spacer, and the like (not shown).

Figure 2:
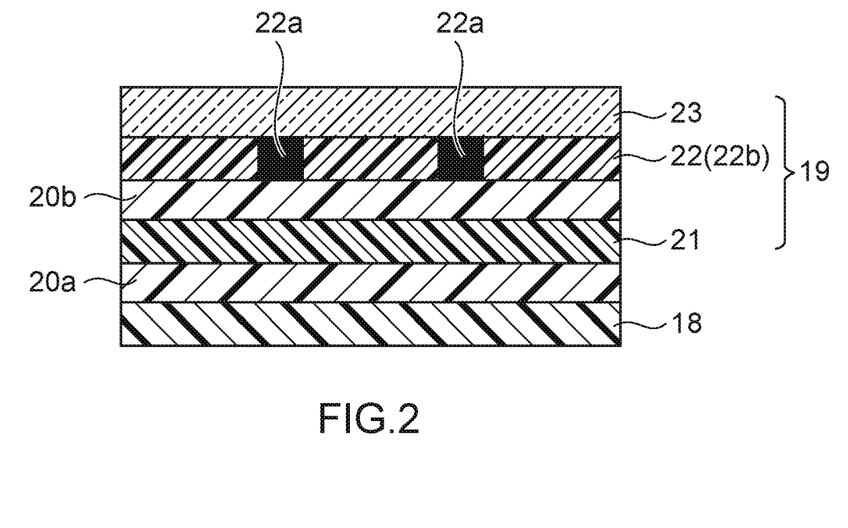
FIG. 2 is a partial schematic sectional view of the liquid crystal display device shown in FIG. 1.

The array substrate 19 includes a thin film transistor (TFT), a pixel electrode, an alignment film, and the like (not shown). As shown in FIG. 2, the array substrate 19 includes: a pair of overcoat layers 20a, 20b; an in-cell polarizer 21 held between the pair of overcoat layers 20a, 20b; a color filter 22 disposed on one overcoat layer 20b and including a light shielding portion 22a and a wavelength conversion layer 22b that contains quantum dots (hereinafter also referred to simply as a "color filter 22"); and a glass substrate 23 disposed on the color filter 22. In the array substrate 19, thin film transistors may be provided between the color filter 22 and the glass substrate 23, and signal lines (sources), scanning lines (gates), a common electrode, pixel electrodes, and the like (not shown) may be provided as appropriate. Further, the channel portion of the thin film transistor has an amorphous silicon layer (semiconductor layer) (not shown), and other than this, the channel portion may be formed of a polysilicon layer (semiconductor layer) with higher mobility.

As thus described, in the liquid crystal display device 1, the light reflecting layer 16, including in a reflection wavelength region the peak wavelength of the light source of the backlight unit 11 that emits excitation light to be used for the emission of the quantum dots, is disposed on the observer side with respect to the wavelength conversion layer 22b containing the quantum dots in the color filter 22. The color filter 22 mentioned herein which includes the wavelength conversion layer 22b containing the quantum dots is, for example, the color filter described in Japanese Patent Application Publication No. 2016-70949 or the like which is prepared by using a color layer formed in a combination of an absorption-type color filter layer and a wavelength conversion layer containing quantum dots and by using only a wavelength conversion layer containing quantum dots, and the color filter 22 is not particularly limited so long as it contains quantum dots.

<Quantum Dots>

Quantum dots (a first quantum dot and a second quantum dot) are semiconductor fine particles having a nanometer size. The quantum dot indicates specific optical and electrical properties due to the quantum confinement effect (quantum size effect), in which electrons and excitons are confined in a small crystal having a nanometer size, and is also referred to as a semiconductor nanoparticle or a semiconductor nanocrystal. The quantum dot is a semiconductor fine particle having a nanometer size and is not particularly limited so long as it is a material that exhibits the quantum confinement effect. As the quantum dot, for example, there are a semiconductor fine particle, in which the emission color is limited by its own particle size, and a semiconductor fine particle having a dopant. Either of the semiconductor fine particles can be used as the quantum dot and both can obtain excellent color purity.

The emission color of the quantum dot varies depending on its particle size. For example, in the case of quantum dots each formed only of a core consisting of CdSe, peak wavelengths of fluorescence spectrums with particle sizes of 2.3 nm, 3.0 nm, 3.8 nm, and 4.6 nm are 528 nm, 570 nm, 592 nm, and 637 nm, respectively. The quantum dots may, for example, contain in the wavelength conversion layer 22b a first quantum dot which is excited by the excitation light from the light source to emit green light, that is, emits secondary light with a wavelength corresponding to green, and a second quantum dot which is excited by the excitation light to emit red light, that is, emits secondary light with a wavelength corresponding to red. The content of the quantum dots is appropriately adjusted in accordance with the thickness of the wavelength conversion layer 22b containing the quantum dots, a light recycling rate in the backlight unit 11, a desired hue, and the like.

A material to be the core of the quantum dot is appropriately selected from the viewpoint of the easiness of preparation, the controllability of the particle size with which emission in a visible light region is obtained, and fluorescence quantum yield. Examples of the material to be the core of the quantum dot include: group II-VI semiconductor compounds such as MgS, MgSe, MgTe, CaS, CaSe, CaTe, SrS, SrSe, SrTe, BaS, BaSe, BaTe, ZnS, ZnSe, ZnTe, CdS, CdSe, CdTe, HgS, HgSe, and HgTe; group III-V semiconductor compounds such as AN, AlP, AiAs, AlSb, GaAs, GaP, GaN, GaSb, InN, InAs, InP, InSb, TiN, TiP, TiAs, and TiSb; semiconductor compounds of group IV semiconductors such as Si, Ge, Pb and a semiconductor crystal and the like containing a semiconductor compound. It is also possible to use a semiconductor crystal containing a semiconductor compound that contains three or more elements such as InGaP. Further, as the quantum dot formed of the semiconductor fine particle having the dopant, it is also possible to use a semiconductor crystal obtained by doping the above semiconductor compound with a cation of a rare-earth metal or a cation of a transition metal, such as EU3+, Tb3+, Ag+, or Cu+.

When the color filter 22 is provided with the wavelength conversion layer 22b containing at least three types of quantum dots that emit blue light, green light, and red light respectively by the excitation light from the light source, it is possible to use a white light source as the light source of the backlight unit 11. As the white light source, for example, a white light-emitting diode (LED) and the like can be cited. As the white LED, for example, a combination of a blue LED and a yellow phosphor (yttrium aluminum garnet (YAG)) can be cited. When the light of the backlight light serves as a blue display and the excitation light, it is possible to perform the image display by emitting blue excitation light (peak wavelength: 450 nm) from the backlight unit 11, and using the color filter 22 provided with the wavelength conversion layer 22b containing two types of quantum dots to respectively emit green light and red light, that is, containing three colors of colorless, green, and red each as one pixel. It is preferable that the peak wavelength of the light source of the backlight unit 11 be 350 to 650 nm.

<In-Cell Polarizer>

The in-cell polarizer 21 is, for example, sandwiched between the pair of overcoat layers 20a, 20b and disposed between the color filter 22 and the liquid crystal layer 18. The in-cell polarizer 21 is, for example, a wire-grid or coating polarizer, or a polarizer having a stretched polymer that contains dichroic dyes. Examples of the coating polarizer include: a chromonic polarizer in which the dichroic dyes are directly oriented; and a guest-host polarizer formed by containing the dichroic dyes in a polymerizable liquid crystal capable of coming into the state of a nematic liquid crystal or a smectic liquid crystal, and immobilizing the orientation of both or one of the polymerizable liquid crystal and the dichroic dyes after the orientation of these. As specific examples of the coating polarizer or the polarizer having the stretched polymer that contains the dichroic dyes, for example, a polarizing element described in U.S. Pat. No. 6,006,210 and the like can be cited.

<Color Filter>

The color filter 22 is disposed on the observer side which is the outer side of the in-cell polarizer 21, that is, the opposite side to the liquid crystal layer 18 side. In the case of a normal liquid crystal display device, an image is displayed by controlling linearly polarized light incident from the backlight-side polarizing plate 13 by the orientation of the liquid crystal molecules of the liquid crystal layer 18, and transmitting only light that matches the direction of the transmission axis of the opposed observer-side polarizing plate 15. However, since the light emitted by the quantum dot is scattered light that is scattered in all directions, when the color filter 22 is disposed between two polarizing plates (polarizers), that is, the backlight-side polarizing plate 13 and the in-cell polarizer 21, polarized light controlled by the liquid crystal is disturbed to greatly affect the display. Especially in a black display, this becomes a major factor of a decrease in contrast. Therefore, it is desirable to dispose the color filter 22 in a position on the outer side of the in-cell polarizer 21, that is, the opposite side to the liquid crystal layer 18 side.

<Liquid Crystal Display Mode>

There is no limit on a liquid crystal display mode used in the liquid crystal display device. Examples of the liquid crystal display mode include: TN (twisted nematic) for switching the orientation of the liquid crystal molecules by using an electric field substantially perpendicular to the substrate surface; VA (vertical alignment); IPS (in plane switching) for switching the orientation of the liquid crystal molecules by using a substantially parallel electric field on the substrate surface; and FFS (fringe field switching) in which electrodes for driving liquid crystals are superimposed in a pixel, and the liquid crystal molecules are switched by a fringe electric field near the electrodes.

<Light Reflecting Layer>

The light reflecting layer 16 has a function of reducing the incidence of external light, such as the sunlight, on the color filter 22. Thereby, the liquid crystal display device 1 can reduce the emission by the external light performed by the color filter 22 that is provided with the wavelength conversion layer 22b containing the quantum dots, to maintain the visibility of a display image. The light reflecting layer 16 is not particularly limited so long as it is able to reflect the light in the wavelength region of the light source that emits the excitation light to be used for the emission of the quantum dots. For the efficient reflection of the external light and efficient extraction of the emitted light from the liquid crystal display device 1, it is preferable that the light reflecting layer 16 be a polarizing reflective layer in which reflected light or transmitted light becomes polarized light. As the polarizing reflective layer, for example, reflective polarizers such as a cholesteric liquid crystal layer, a wire-grid polarizer, a multilayer birefringence interference polarizer, and a prism polarizer can be cited. By matching the transmission axis of the polarizing reflective layer with the transmission axis of the observer-side polarizing plate 15 of the liquid crystal display device 1, it is possible to effectively reflect the external light while preventing a decrease in transmittance of the emitted light from the liquid crystal display device 1. These polarizing reflective layers are appropriately designed to be able to reflect at least the light containing the peak wavelength of the light source that emits excitation light to be used for the emission of the quantum dots.

When the reflective polarizer such as a wire-grid polarizer, a multilayer birefringence interference polarizer, a prism polarizer, or a cholesteric liquid crystal layer is used as the polarizing reflective layer, if the visible light region is widely reflected, the surface may become like a mirror. In such a case, it is desirable to adjust the reflection wavelength region of the polarizing reflective layer so as to selectively reflect the wavelength region of the excitation light. In particular, the cholesteric liquid crystal layer is suitably used since having a property of selectively reflecting a specific wavelength region.

The cholesteric liquid crystal used for the polarizing reflective layer is obtained from a nematic liquid crystal having a chirality or a compound formed by adding a chiral agent to the nematic liquid crystal. It is preferable to obtain the cholesteric liquid crystal by adding the chiral agent to the nematic liquid crystal because the direction of a helix and the reflection wavelength can be designed in an optionally selected manner based on the type and the amount of the chiral agent. Unlike a liquid crystal operated in a so-called electric field, the nematic liquid crystal is used while a helical oriented state is immobilized. It is thus preferable to obtain the nematic liquid crystal by using a nematic liquid crystal monomer having a polymerizable group.

(Polymerizable Liquid Crystal Monomer)

The nematic liquid crystal monomer having the polymerizable group is a compound having a polymerizable group in a molecule and exhibiting the liquid crystallinity in a temperature range or a concentration range. As the polymerizable group, for example, a (meth)acryloyl group, a vinyl group, a chalconyl group, a cinnamoyl group, an epoxy group, and the like can be cited. Further, it is preferable that a mesogenic group be in the molecule in order to exhibit the liquid crystallinity, and the mesogenic group means, for example, rod-like or plate-like substituents such as a biphenyl group, a terphenyl group, a (poly)benzoic acid phenyl ester group, a (poly)ether group, a benzylidene aniline group, and an acenaphtho-quinoxaline group, or disc-like substituents such as a triphenylene group, a phthalocyanine group, and an azacrown group, that is, a group having the ability to induce the behavior of a liquid crystal phase. The liquid crystal compound having the rod-like or plate-like substituent is known in the art as a calamitic liquid crystal. As the nematic liquid crystal monomer having such a polymerizable group, specifically, polymerizable liquid crystals described in Japanese Patent Application Publication No. 2003-315556 and Japanese Patent Application Publication No. 2004-29824, Paliocolor series (manufactured by BASF SE), RMM series (manufactured by Merck KGaA), and the like can be cited. These nematic liquid crystal monomers having the polymerizable groups can be used singly or in a mixture of two or more of them.

(Chiral Agent)

As the chiral agent, it is preferable to use a compound that can cause the nematic liquid crystal monomer having the polymerizable group to have right-handed or left-handed helical orientation, and has a polymerizable group similarly to the nematic liquid crystal monomer having the polymerizable group. As such a chiral agent, for example, Paliocolor LC756 (manufactured by BASF SE), a compound described in Japanese Patent Application Publication No. 2002-179668, and the like can be cited. The direction of circularly polarized light to be reflected is determined based on the type of the chiral agent, and further, it is possible to change the reflection wavelength of the light reflecting layer in accordance with the amount of the chiral agent added to the nematic liquid crystal. For example, as the amount of the chiral agent added is increased, the light reflecting layer 16 which reflects a wavelength on the shorter wavelength side can be obtained. The amount of the chiral agent added varies depending also on the type of the chiral agent and the wavelength to be reflected. From the viewpoint of adjusting a central reflection wavelength $\lambda 2$ of the light reflecting layer 16 with the normal light to be in a desired wavelength region, as the amount of the chiral agent added relative to 100 parts by mass of the nematic liquid crystal monomer having the polymerizable group, about 0.5 part by mass or more and 30 parts by mass or less are preferred, about 1 part by mass or more and 20 parts by mass or less are more preferred, and about 3 parts by mass or more and 10 parts by mass or less are further preferred.

(Ultraviolet-Curable Resin)

Moreover, it is also possible to use a polymerizable compound having no liquid crystallinity and being able to react with the nematic liquid crystal monomer having the polymerizable group. As such a compound, for example, an ultraviolet-curable resin and the like can be cited. Examples of the ultraviolet-curable resin include lauryl (meth)acrylate, dipentaerythritol hexa(meth)acrylate, and ester-based urethane acrylate resins and urethane (meth)acrylate-based resins such as dipentaerythritol penta(meth)acrylate and 1,6-hexamethylene-diisocyanate, a reaction product of triisocyanate having an isocyanuric ring and pentaerythritol tri(meth)acrylate, and a reaction product of pentaerythritol tri(meth)acrylate and isohoron-diisocyanate, a reaction product of dipentaerythritol penta(meth)acrylate, dipentaerythritol tetra (meth)acrylate, pentaerythritol tetra(meth) acrylate, pentaerythritol tri(meth)acrylate, trimethylolpropane tri(meth)acrylate, ditrimethylolpropane tetra(meth) acrylate, tris(acryloxyethyl) isocyanurate, tris (methachyroxyethyl) isocyanurate, a reaction product of glycerol triglycidyl ether and (meth)acrylic acid, caprolactone-modified tris(acryloxyethyl) isocyanurate, a reaction product of trimethylolpropane triglycidyl ether and (meth) acrylic acid, triglycerol-di-(meth)acrylate, a reaction product of propylene glycol-di-glycidyl ether and (meth)acrylic acid, polypropylene glycol-di-(meth)acrylate, tri-propylene glycol-di-(meth)acrylate, polyethylene glycol-di-(meth) acrylate, tetraethylene glycol-di-(meth)acrylate, triethylene glycol-di-(meth)acrylate, pentaerythritol-di-(meth)acrylate, a reaction product of 1,6-hexanediol-di-glycidyl ether and (meth)acrylic acid, 1,6-hexanediol-di-(meth)acrylate, glycerol-di-(meth)acrylate, a reaction product of ethylene glycol-di-glycidyl ether and (meth)acrylic acid, a reaction product of diethylene glycol-di-glycidyl ether and (meth)acrylic acid, bis(acryloxyethyl) hydroxyethyl isocyanurate, bis (methachyroxyethyl) hydroxyethyl isocyanurate, a reaction product of bisphenol A-di-glycidyl ether and (meth)acrylic acid, tetrahydrofurfuryl (meth)acrylate, caprolactone-modified tetrahydrofurfuryl (meth)acrylate, 2-hydroxyethyl (meth)acrylate, 2-hydroxypropyl (meth)acrylate, polypropylene glycol (meth)acrylate, polyethylene glycol (meth) acrylate, phenoxyhydroxypropyl (meth)acrylate, acryloyl morpholine, methoxypolyethylene glycol (meth)acrylate, methoxytetraethylene glycol (meth)acrylate, methoxytriethylene glycol (meth)acrylate, methoxyethylene glycol (meth) acrylate, methoxyethyl (meth)acrylate, glycidyl (meth)acrylate, glycerol (meth)acrylate, ethyl carbitol (meth)acrylate, 2-ethoxyethyl (meth)acrylate, N,N-dimethylaminoethyl (meth)acrylate, 2-cyanoethyl (meth)acrylate, a reaction product of butyl glycidyl ether and (meth)acrylic acid, butoxytriethylene glycol (meth)acrylate, and butanediol mono (meth)acrylate. These ultraviolet-curable resins may be used singly or in a mixture of two or more of them. Among these, as the ultraviolet-curable resin, it is preferable to use at least one selected from the group consisting of lauryl (meth)acrylate, dipentaerythritol hexa(meth)acrylate, the ester-based urethane (meth)acrylate resin, and the urethane (meth)acrylate-based resin. These ultraviolet-curable resins having no liquid crystallinity are added to the extent that the liquid crystallinity will not be lost. As the amount of the ultraviolet-curable resin added relative to 100 parts by mass of the nematic liquid crystal monomer having the polymerizable group, 0.1 part by mass or more and 20 parts by mass or less are preferred, and about 1.0 part by mass or more and 10 parts by mass or less are more preferred.

(Photopolymerization Initiator)

When the nematic liquid crystal monomer having the polymerizable group and other polymerizable compounds are an ultraviolet-curable type, a photopolymerization initiator is added to cure a composition containing these by ultraviolet rays. Examples of the photopolymerization initiator include: acetophenone compounds such as 2-methyl-1-[4-(methylthio) phenyl]-2-morpholino propane-1 (Irgacure 907, manufactured by BASF SE), 1-hydroxycyclohexylphenyl ketone (Irgacure 184, manufactured by BASF SE), 4-(2-hydroxyethoxy)-phenyl (2-hydroxy-2-propyl) ketone (Irgacure 2959, manufactured by BASF SE), 1-(4-dodecylphenyl)-2-hydroxy-2-methylpropane-1-on (Darocur 953, manufactured by Merck KGaA), 1-(4-isopropylphenyl)-2-hydroxy-2-methylpropane-1-one (Darocur 1116, manufactured by Merck KGaA), 2-hydroxy-2-methyl-1-phenylpropane-1-one (Irgacure 1173, manufactured by BASF SE), and diethoxyacetophenone; benzoin-based compounds such as benzoin, benzoin methyl ether, benzoin ethyl ether, benzoin isopropyl ether, benzoinisobutyl ether, and 2,2-dimethoxy-2-phenylacetophenone (Irgacure 651, manufactured by BASF SE); benzophenone compounds such as benzoyl benzoic acid, methyl benzoyl benzoate, 4-phenylbenzophenone, hydroxybenzophenone, 4-benzoyl-4'-methyldiphenylsulfide, and 3,3'-dimethyl-4-methoxybenzophenone (Kayacure MBP, manufactured by Nippon Kayaku Co., Ltd.); and thioxanthone compounds such as thioxanthone, 2-chlorothioxantone (Kayacure CTX, manufactured by Nippon Kayaku Co., Ltd.), 2-methylthioxanthone, 2,4-dimethylthioxanthones (Kayacure RTX, manufactured by Nippon Kayaku Co., Ltd.), isopropylthioxanthone, 2,4-dichlorothioxanthone (Kayacure CTX, manufactured by Nippon Kayaku Co., Ltd.), 2,4-diethylthioxanthone (Kayacure DETX, manufactured by Nippon Kayaku Co., Ltd.), and 2,4-diisopropylthioxanthone (Kayacure DITX, manufactured by Nippon Kayaku Co., Ltd.). Preferably, for example, Irgacure TPO, Irgacure TPO-L, Irgacure OXE01, Irgacure OXE02, Irgacure 1300, Irgacure 184, Irgacure 369, Irgacure 379, Irgacure 819, Irgacure 127, Irgacure 907, and Irgacure 1173 (all are, manufactured by BASF Co., Ltd.) can be cited, and particularly preferably, Irgacure TPO, Irgacure TPO-L, Irgacure OXE01, Irgacure OXE02, Irgacure 1300, and Irgacure 907 can be cited. These photopolymerization initiators can be used singly or in a mixture of two or more of them at any ratio.

In the case of using the benzophenone compound or the thioxanthone compound as the photopolymerization initiator, it is also possible to simultaneously use an auxiliary so as to accelerate a photopolymerization reaction. Examples of such an auxiliary include amine compounds such as triethanolamine, methyldiethanolamine, triisopropanolamine, n-butylamine, n-methyldiethanolamine, diethyl aminoethyl methacrylate, Michler's ketone, 4,4'-diethylaminophenone, Ethyl 4-dimethylaminobenzoate, 4-dimethylaminobenzoic acid (n-butoxy)ethyl, and 4-dimethylamino benzoic acid isoamyl. These auxiliaries may be used singly or may be used in a combination of two or more of them.

It is preferable to use the added amounts of the photopolymerization initiator and the auxiliary in a range not affecting the liquid crystallinity of the composition containing the nematic liquid crystal monomer. As the added amounts of these relative to 100 parts by mass of the compound to be cured with ultraviolet rays in the composition, 0.5 part by mass or more and 10 parts by mass or less are preferred, and about 2 parts by mass or more and 8 parts by mass or less are more preferred. Further, as the amount of the auxiliary added relative to the photopolymerization initiator, about 0.5 times or more and twice or less are preferred.

(Other Additives)

In the case of using the ultraviolet-curable resin, when necessary, a variety of additives can further be used, such as a plasticizer, an ultraviolet absorber, an antioxidant, a light stabilizer, a leveling agent, an antifoaming agent, heat-ray shielding fine particles, a surface conditioner, various dyes, pigments, and fluorescent dyes.

As a method for preparing the polarizing reflective layer by using the cholesteric liquid crystal, for example, a chiral agent for causing the right-handed or left-handed helical orientation is added to the nematic liquid crystal monomer having the polymerizable group in a required amount so that a desired wavelength is reflected. Thereafter, these are dissolved in a solvent, and the photopolymerization initiator is added. Although such a solvent is not particularly limited so long as it is able to dissolve the liquid crystal monomer, the chiral agent, and the like which are used, for example, cyclopentanone, anisole, and methyl ethyl ketone are preferred. Then, the solution is applied on a plastic substrate such as a PET (polyethylene terephthalate) film, a TAC (triacetyl cellulose) film, a COP (cycloolefin polymer) film, or an acrylic film so as to have a thickness as uniform as possible, which is allowed to stand for a certain time in such a temperature condition that a cholesteric liquid crystal is obtained on the substrate and oriented at a desired helical pitch, while the solvent is removed by heating. At this time, by performing orientation treatment such as rubbing or stretching before the application on the surface of the plastic substrate, the orientation of the cholesteric liquid crystal can be made more uniform, and a haze value as the polarizing reflective layer can be reduced. Subsequently, while the oriented state is held, ultraviolet rays are applied with a high-pressure mercury lamp or the like and the orientation is immobilized to obtain the polarizing reflective layer. Here, when the chiral agent for causing the right-handed helical orientation is selected, the obtained polarizing reflective layer selectively reflects right-handed circularly polarized light, whereas when the chiral agent for causing the left-handed helical orientation is selected, the obtained light reflecting layer selectively reflects left-handed circularly polarized light. A phenomenon that this particular circularly polarized light is selectively reflected is referred to as selective reflection, and a wavelength band where the selective reflection takes place is referred to as a selective reflection region. Further, the plastic substrate to be used can also be used as the protective layer of the light reflecting layer 16 by being used as disposed so as to be on the observer side of the liquid crystal display device 1. Moreover, for enhancing the strength of the protective layer, a hard coat layer may be formed on the surface of the plastic substrate on the opposite side to the light reflecting layer 16.

The reflectance of the light reflecting layer 16 can be appropriately adjusted by changing the thickness of the light reflecting layer 16 during the preparation of the light reflecting layer. As the reflectance of the light reflecting layer 16 relative to the excitation light wavelength of the external light of target, 10% or more and 100% or less are preferred, 20% or more and 100% or less are more preferred, and 30% or more and 100% or less are further preferred. In the case of using the cholesteric liquid crystal as the polarizing reflective layer, the maximum reflectance of the light reflecting layer 16 in each of the right-handed helical orientation and the left-handed helical orientation is 50%, so that when the cholesteric liquid crystal layers having the respective orientations are laminated and used, it is possible in theory to reflect the excitation light from the external light up to 100%.

Figure 3:
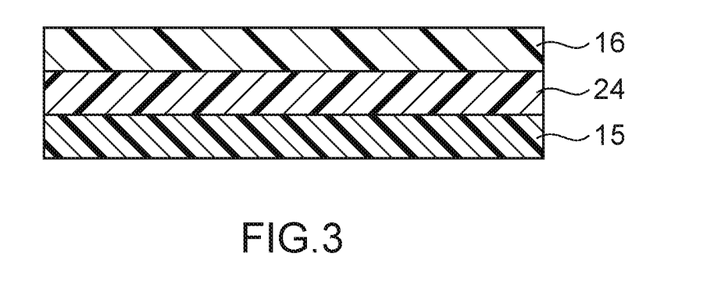
FIG. 3 is a partial schematic sectional view showing the placement relationship of a quarter-wave plate in the image display device according to the first embodiment of the present disclosure.

When both the cholesteric liquid crystal layer having the right-handed helical orientation and the cholesteric liquid crystal layer having the left-handed helical orientation are laminated and used as the polarizing reflective layer, there is a case where the external light is excessively reflected depending on the reflectance. In such a case, it is preferable to use either the cholesteric liquid crystal layer having the right-handed helical orientation or the cholesteric liquid crystal layer having the left-handed helical orientation. Then, as shown in FIG. 3, a quarter-wave plate 24 may be disposed between the observer-side polarizing plate 15 and the light reflecting layer 16 which is the cholesteric liquid crystal layer such that an angle between a polarization axis (absorption axis or transmission axis) of the observer-side polarizing plate 15 and a slow axis of the quarter-wave plate 24 is 45°. At this time, it is preferable to dispose the quarter-wave plate 24 with its slow axis in such a direction that, when circularly polarized light transmitted through the cholesteric liquid crystal layer (for example, in a case where the cholesteric liquid crystal layer has the right-handed helical orientation, the reflected light becomes right-handed circularly polarized light and the transmitted light becomes left-handed circularly polarized light) is converted into linearly polarized light by the quarter-wave plate 24, the polarization axis of the linearly polarized light matches the absorption axis of the observer-side polarizing plate 15. By the placement in this way, the excitation light contained in the external light is reflected up to 50% by the cholesteric liquid crystal layer, and the remaining circularly polarized light further transmitted through the cholesteric liquid crystal layer is converted into linearly polarized light by the quarter-wave plate 24 and is absorbed by the observer-side polarizing plate 15. As a result, it is possible to significantly reduce the incidence of excitation light contained in the external light on the color filter 22.

Further, in the case of using the cholesteric liquid crystal layer of either the right-handed helix or the left-handed helix, as shown in FIG. 3, the quarter-wave plate 24 is disposed between the observer-side polarizing plate 15 and the light reflecting layer 16 that is the cholesteric liquid crystal layer. Here, the quarter-wave plate 24 may be disposed such that the angle between the polarization axis (absorption axis or transmission axis) of the observer-side polarizing plate 15 and the slow axis of the quarter-wave plate 24 is 45°. In this case, it is preferable to dispose the slow axis of the observer-side polarizing plate 15 such that when the linearly polarized light out of the observer-side polarizing plate 15 becomes circularly polarized light in the quarter-wave plate 24, the linearly polarized light becomes circularly polarized light that rotates opposite to the rotating direction of the circularly polarized light reflected by the light reflecting layer 16. By the placement in this way, the linearly polarized light out of the observer-side polarizing plate 15 is converted into circularly polarized light by the quarter-wave plate 24. Thereby, the converted circularly polarized light reaches the observer without being reflected by the light reflecting layer 16 that is the cholesteric liquid crystal layer, and simultaneously, the light with the excitation light wavelength contained in the external light is also reflected, so that it is possible to reduce the emission of the quantum dots by external light.

The reflection wavelength of the light reflecting layer 16 is appropriately adjusted so as to include a whole or part of the wavelength region of the excitation light that is for the emission of quantum dots emitted by the light source of the backlight unit 11. The reflection wavelength region of the light reflecting layer 16 includes the peak wavelength of the excitation light from the light source of the backlight unit 11. As the absolute value of the difference between the central reflection wavelength of the light reflecting layer 16 and the peak wavelength of the excitation light from the light source of the backlight unit 11, for example, 0 nm or more and 70 nm or less are preferred, 0 nm or more and 50 nm or less are more preferred, 0 nm or more and 30 nm or less are further preferred, and 0 nm or more and 20 nm or less are particularly preferred. As the central reflection wavelength of the light reflecting layer 16, 350 nm or more and 750 nm or less are preferred. For example, when the peak wavelength of the excitation light from the light source of the backlight unit 11 is 380 nm, as the central reflection wavelength of the light reflecting layer 16, 350 nm or more and 450 nm or less are preferred, and 360 nm or more and 400 nm or less are more preferred. For example, when the peak wavelength of the excitation light from the light source of the backlight unit 11 is 450 nm, as the central reflection wavelength of the light reflecting layer 16, 400 nm or more and 500 nm or less are preferred, and 430 nm or more and 480 nm or less are more preferred. For example, when the peak wavelength of the excitation light from the light source of the backlight unit 11 is 550 nm, as the central reflection wavelength of the light reflecting layer 16, 500 nm or more and 600 nm or less are preferred, and 530 nm or more and 580 nm or less are more preferred. For example, when the peak wavelength of the excitation light from the light source of the backlight unit 11 is 650 nm, as the central reflection wavelength of the light reflecting layer 16, 600 nm or more and 750 nm or less are preferred, and 630 nm or more and 680 nm or less are more preferred. The central reflection wavelength means a wavelength to be an average of a wavelength on the short wavelength side and a wavelength on the long wavelength side corresponding to 80% of the maximum reflectance of the light reflecting layer 16. For example, in a case where the maximum reflectance of the light reflecting layer 16 is 20%, when a wavelength $\lambda 1$ on the short wavelength side and a wavelength $\lambda 3$ on the long wavelength side showing a reflectance of 16% which corresponds to 80% of the maximum reflectance, $\lambda 2$ represented by Formula (1) below is the central reflection wavelength.

$$(\lambda 1+\lambda 3)/2=\lambda 2 \quad \text{Formula (1)}$$

The light reflecting layer 16 is not limited to one layer, but two or more layers may be laminated. For example, when the wavelength of the excitation light is broad, the reflection band of the light reflecting layer 16 may be insufficient. In such a case, by laminating a plurality of light reflecting layers 16 having different central reflection wavelengths, it is possible to reflect external light in a wide band. Further, when the light reflecting layer 16 includes the cholesteric liquid crystal layer, it may not be possible to ensure a sufficient reflection band depending on the birefringence of the liquid crystal. In such a case, for example, a plurality of cholesteric liquid crystal layers having different central reflection wavelength of 400 nm or more and 500 nm or less, 500 nm or more and 600 nm or less, and 600 nm or more and 750 nm or less may be laminated, or the helical pitch of the cholesteric liquid crystal may be continuously changed to expand the reflection band in one layer of the light reflecting layer 16.

The reflection wavelength region of the cholesteric liquid crystal layer has a property of shifting to the short wavelength side as the incident angle of light is inclined in an oblique direction. Therefore, in the cholesteric liquid crystal layer, when the incident angle of the external light is in an oblique direction with respect to the display surface of the liquid crystal display device 1, by previously adjusting the central reflection wavelength to the long wavelength side in accordance with the angle, the more effective reflection of the external light is possible. In this case, for example, when the incident angle of the external light is 20° or more and 50° or less, it is preferable that the central reflection wavelength of the light reflecting layer 16 be closer to the long wavelength side than the peak wavelength of the excitation light by about 20 nm or more and 80 nm or less, and it is more preferable that the central reflection wavelength be closer to the long wavelength side by about 20 nm or more and 50 nm or less. Specifically, when the peak wavelength of the excitation light from the light source of the backlight unit 11 is 450 nm and the incident angle of the external light is 20° or more and 50° or less, by the central reflection wavelength of the cholesteric liquid crystal layer being 470 nm or more and 530 nm or less, it is possible to more effectively reflect the excitation light wavelength (450 nm) contained in the external light. Further, for example, by laminating a plurality of cholesteric liquid crystal layers having different central reflection wavelength of 400 nm or more and 500 nm or less, 500 nm or more and 600 nm or less, and 600 nm or more and 750 nm or less, or by previously changing the helical pitch of the cholesteric liquid crystal continuously to expand the reflection band in one layer of the light reflecting layer 16, it is possible to effectively reflect the peak wavelength of the excitation light contained in the sunlight without adjusting the reflection wavelength region of the cholesteric liquid crystal layer in consideration of the incident angle of the sunlight.

As in the cholesteric liquid crystal layer, when only a specific wavelength is reflected, there is a case where the transmitted light is colored. In such a case, the color reproducibility of the image may be adjusted by adjusting the emission spectrum of light emitted from the liquid crystal display device 1. As a method for this, for example, a method of adjusting the respective emission intensities of blue light, green light, and red light from the color filter 22 can be cited. Further, the reflectance, the haze, or the like of the light reflecting layer 16 may be adjusted to adjust the color tone of the transmitted light to neutral. From the viewpoint of being able to achieve both the light reflectivity and the neutrality of the transmitted light, as the haze value of the light reflecting layer 16, 0.5% or more and 5.0% or less are preferred, and 0.8% or more and 3.0% or less are more preferred. In the liquid crystal display device 1, a light absorbing layer for adjusting the color reproducibility of the display image may further be disposed on the front or back of the light reflecting layer 16.

(Polarizing Plate)

The observer-side polarizing plate 15 is a polarizing element that absorbs polarized light in a particular direction by the unidirectional orientation of dichroic dyes such as iodine and dye. In general, it is possible to obtain such a polarizing element by impregnating the dichroic dyes into a polyvinyl alcohol film and then uniaxially stretching the obtained polyvinyl alcohol film in a boric-acid aqueous solution. It is possible to adjust the hue of the polarizing element in accordance with the state of an iodine-polyvinyl alcohol complex to be used, the blending ratio of the dichroic dyes to be used, or the like. Therefore, by adjusting the hue, the observer-side polarizing plate 15 can also be used for adjusting the color reproducibility of the display image. Normally, the polarizing element is inferior in mechanical strength, and hence the polarizing element is protected by being held between transparent plastic films of triacetyl cellulose, a cycloolefin polymer, or the like.

(Quarter-Wave Plate)

The quarter-wave plate 24 is a phase-difference element having a function of converting circularly polarized light into linearly polarized light. The quarter-wave plate 24 can be obtained by, for example, uniaxial stretching a film made of polycarbonate or a cycloolefin polymer such that the phase difference is a quarter of the wavelength, or by orienting a horizontally oriented polymerizable liquid crystal with such a thickness that the phase difference is a quarter of the wavelength. The quarter-wave plate 24 may be used singly, or when the deviation of the phase difference due to wavelength dispersion is large, a phase-difference element called a broadband quarter-wave plate may be used. The broadband quarter-wave plate is a phase-difference element with reduced wavelength dependence of the phase difference, and examples of the broadband quarter-wave plate include: a phase-difference element formed by laminating a half-wave plate and a quarter-wave plate having the same wavelength dispersion such that the angle between the slow axes of the respective wave plates is 60°; and polycarbonate-based phase-difference element with reduced wavelength dependence of the phase difference (PURE-ACE WR-S, manufactured by TEIJIN LIMITED). In the quarter-wave plate 24, a phase-difference value changes depending on the incident angle of polarized light, and hence it is possible to prevent the change in phase difference associated with the incident angle by previously adjusting the phase-difference value in accordance with the environment to be used or the like, or by using the phase-difference element where the refractive index of the phase-difference element has been adjusted. As such an example, when the refractive index in the slow-axis direction in the plane of the phase-difference element is nx, the refractive index in the direction perpendicular to nx in the plane is ny, and the refractive index in the thickness direction is nz, the control is performed such that a coefficient Nz represented by the following formula (2) is preferably 0.3 or more and 1.0 or less and more preferably about 0.5 or more and 0.8 or less.

$$Nz=(nx-nz)/(nx-ny) \quad \text{Formula (2)}$$

As the phase-difference value of the quarter-wave plate 24, about a quarter of the peak wavelength of the excitation light to be a target is preferred, and specifically, at least 90 nm or more and 125 nm or less are preferred. For example, when the peak wavelength of the excitation light is 400 nm, it is preferable that the phase-difference value of the quarter-wave plate 24 be about 90 nm or more and 110 nm or less, and when the peak wavelength of the excitation light is 450 nm, it is preferable that the phase-difference value of the quarter-wave plate 24 be about 100 nm or more and 125 nm or less. In addition, such a phase-difference element as the broadband quarter-wave plate which functions as a quarter-wave plate for each wavelength is particularly preferred as eliminating the need of adjustment for each wavelength. The broadband quarter-wave plate is a phase-difference element with reduced wavelength dependence of the phase difference, and examples of the broadband quarter-wave plate include: a phase-difference element formed by laminating a half-wave plate and a quarter-wave plate having the same wavelength dispersion such that the angle between the slow axes of the respective wave plates is 60 degrees; polycarbonate-based phase-difference element with reduced wavelength dependence of the phase difference (PURE-ACE WR-S, manufactured by TEIJIN LIMITED); and a phase-difference element using a polymerizable liquid crystal described in Example 7 of the U.S. Pat. No. 6,133,456.

Figure 4:
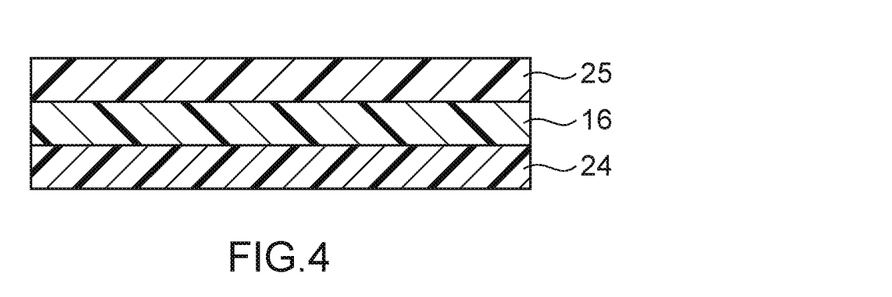
FIG. 4 is a partial schematic sectional view showing the placement of an anti-reflective layer in the image display device according to the first embodiment of the present disclosure.

The light reflecting layer 16 reflects the external light to reduce the emission of the quantum dots by the external light. On the other hand, when there is glare due to the reflection of the light reflecting layer 16, reflected glare of things in the periphery, or the like, for example, as shown in FIG. 4, an anti-reflective layer 25 can also be disposed directly or indirectly on the outermost surface on the observer side of the light reflecting layer 16 in the liquid crystal display device 1. Examples of the anti-reflective layer 25 include: a so-called anti-reflective film (AR) formed by laminating a layer having a high refractive index and a layer having a low refractive index with a predetermined thickness; and a so-called anti-glare layer (AG) in which fine particles that scatter light are dispersed in a binder and fine irregularities are provided on the surface to scatter light. In a case where the light reflecting layer 16 is the cholesteric liquid crystal layer, even when the anti-reflective layer 25 is placed on the surface of the light reflecting layer 16, the reflective function of the external light is maintained in the anti-reflective layer 25. Therefore, in such a case, it is preferable to use the anti-reflective layer 25. Examples of the method for disposing the anti-reflective layer 25 include: a method of forming the anti-reflective layer 25 on a transparent plastic film with a small phase difference, such as a TAC film or a COP film, and then laminating the anti-reflective layer 25 on the light reflecting layer 16 by using a pressure-sensitive adhesive or a bonding adhesive; and a method of forming the anti-reflective layer 25 directly on the light reflecting layer 16.

(Other Phase-Difference Films)

A phase-difference film for improving a viewing angle may be disposed as needed between the observer-side polarizing plate 15 and the array substrate 19 and/or between the backlight-side polarizing plate 13 and the counter substrate. Different phase-difference films may be used depending on the liquid crystal display method. As the phase-difference film, a phase-difference film having a hybrid-oriented discotic liquid crystal layer is suitably used when the liquid crystal display mode is TN (in this case, the phase-difference film is also disposed between the backlight-side polarizing plate 13 and the counter substrate 17), a phase-difference film called Negative-C-Plate is suitably used in the case of VA, and a laminate of Negative-A-Plate or A-Plate and Positive-C-Plate, or the like, is suitably used in the case of IPS.

Second Embodiment

Figure 5:
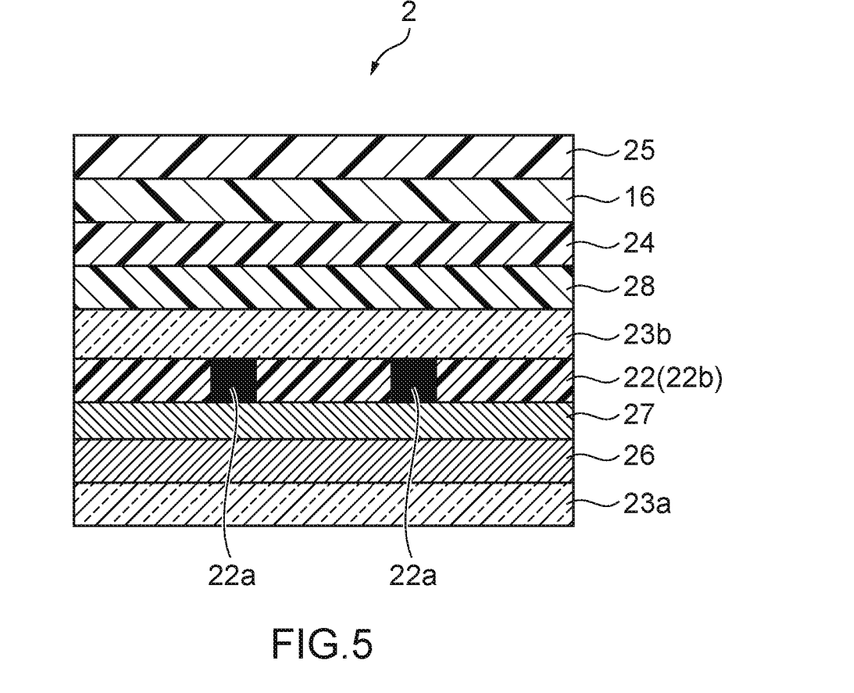
FIG. 5 is a schematic sectional view of an organic EL display which is another example of the image display device according to a second embodiment of the present disclosure.

Next, a second embodiment will be described. In the second embodiment, a case in which the screen display device is an organic EL display (OLED) will be described. The organic EL display can be obtained in such a manner that in a typical organic EL display having a wavelength conversion layer that contains quantum dots, a light reflecting layer, which contains in a reflection wavelength region a peak wavelength of a light source for emitting excitation light to be used for emission of quantum dots, is disposed on the side closer to the observer than the wavelength conversion layer containing the quantum dots.

For example, as shown in FIG. 5, an organic EL display 2 includes an anti-reflective layer 25, a light reflecting layer 16, a quarter-wave plate 24, a circularly polarizing plate 28, a glass substrate 23b, a color filter 22 provided with a light shielding portion 22a and a wavelength conversion layer 22b containing quantum dots, an organic EL layer 27, thin film transistor (TFT) 26, and a glass substrate 23a in this order from the observer side. In FIG. 5, the same reference numerals are given to the constituents in common with the liquid crystal display device 1 shown in FIG. 1 to FIG. 4, and the functions thereof are also assumed to be the same. That is, the light reflecting layer 16, the color filter 22 provided with the light shielding portion 22a and the wavelength conversion layer 22b containing the quantum dots, the glass substrate 23, the quarter-wave plate 24, and the anti-reflective layer 25, described in the first embodiment, can also be used in the organic EL display 2 in the same manner, and the functions thereof are also assumed to be the same. The organic EL Layer 27, which is also an emission layer formed on the thin film transistor 26, emits only blue light. The blue light has the same wavelength as that of the excitation light for the quantum dots contained in the wavelength conversion layer 22b of the color filter 22 (for example, 450 nm). Similarly to the liquid crystal display device 1 shown in the first embodiment, the color filter 22 provided with the wavelength conversion layer 22b containing the quantum dots includes three colors of colorless, green, and red each as one pixel, and each of the green and red pixels includes the wavelength conversion layer 22b containing quantum dots. Further, on the observer side, the circularly polarizing plate 28 is provided as an optionally selected configuration. In a typical organic EL display, the color filter 22 might emit light due to excitation light contained in external light. However, by disposing the light reflecting layer 16 described above in the first embodiment on the side where the external light is incident on the color filter 22, specifically, on the top front of the display, it is possible to reduce the incidence of the external light such as the sunlight on the color filter 22 of the display and perform the display with excellent visibility. Further, when the circularly polarizing plate 28 is disposed, in the same manner as in the liquid crystal display device 1 shown in the first embodiment, by appropriately disposing the quarter-wave plate 24 between the light reflecting layer 16 and the circularly polarizing plate 28, light emitted from the circularly polarizing plate 28 can be emitted without being reflected by the light reflecting layer 16. Moreover, the anti-reflective layer 25 may be disposed on the outermost surface as an optionally selected configuration. The other configurations are the same as in the first embodiment described above, and hence the description thereof will be omitted.

EXAMPLES

Hereinafter, the present disclosure will be described in detail by examples. The present disclosure is not limited in any way by the following examples and comparative examples. Further, in the following examples, a "part" means a part by mass.

Example 1

<Preparation of Light Reflecting Layer>

A light reflecting layer was prepared by the following procedure and the obtained light reflecting layer and quarter-wave plate are laminated to obtain a laminate.
(1) A coating solution (R1) having a composition shown in Table 1 was prepared.
(2) As a plastic substrate, a PET film (product name: A4100, thickness: 50 μm) manufactured by TOYOBO CO., LTD. was prepared, which has no undercoat layer and the surface previously rubbed by the method described in Example 1 of Japanese Patent Application Publication No. 2002-90743. On the rubbed surface of the PET film, the coating solution was applied at room temperature by using a wire bar such that the thickness of the light reflecting layer obtained after drying was 4 μm.
(3) The coated film was heated at 150° C. for 5 minutes to remove the solvent and obtain a cholesteric liquid crystal phase. Then, UV irradiation was performed by a high-pressure mercury lamp (manufactured by HARISON TOSHIBA LIGHTING Corporation) at an output of 120 W for five to ten seconds to fix the cholesteric liquid crystal phase and obtain a light reflecting layer on the PET film.
(4) The light reflecting layer on the PET film prepared in (2) to (3) and a quarter-wave plate (PURE-ACE WR-S, manufactured by TEIJIN LIMITED) having a phase-difference value of 115 nm in 480 nm were laminated using an acrylic pressure-sensitive adhesive (acrylic pressure-sensitive adhesive SK-Dyne 906, manufactured by Soken Chemical & Engineering Co., Ltd.) to obtain a laminate.
(5) The PET film was peeled.

<Evaluation of Light Reflecting Layer>

As a result of measuring the reflectance in the visible light region of the obtained light reflecting layer by using a spectrophotometer (F20-UVX, manufactured by Filmetrics Japan, Inc.), a central reflection wavelength was 450 nm (a half-width was 123 nm), and a reflectance in the central reflection wavelength was 47%.

The composition of the coating solution (R1) is shown in Table 1 below.

TABLE 1

| MATERIAL (TYPE) | MATERIAL NAME (MANUFACTURER) | AMOUNT ADDED (PARTS) |
|---|---|---|
| POLYMERIZABLE LIQUID CRYSTAL MOMOMER | LC242 (BASF) | 20.00 |
| CHIRAL AGENT | LC756 (BASF) | 1.54 |
| PHOTOPOLYMERIZATION INITIATOR | Iragacure TPO (BASF) | 1.00 |
| SOLVENT | Cyclopentanone | 80.00 |

Examples 2 to 6

<Preparation of Light Reflecting Layer>

Each of coating solutions (R2) to (R6) shown in Table 2 was prepared and in the same manner as in Example 1, a laminate of a light reflecting layer with a thickness of about 1 μm and a quarter-wave plate was prepared.

The compositions of the coating solutions (R2) to (R6) are shown in Table 2 below.

TABLE 2

| MATERIAL (TYPE) | MATERIAL NAME (MANUFACTURER) | AMOUNT ADDED (PARTS) | | | | |
|---|---|---|---|---|---|---|
| | | R2 | R3 | R4 | R5 | R6 |
| POLYMERIZABLE LIQUID CRYSTAL MOMOMER | LC242 (BASF) | 29.7 | 30.6 | 30.0 | 30.8 | 31.4 |
| CHIRAL AGENT | LC756 (BASF) | 1.8 | 1.9 | 1.9 | 1.8 | 1.9 |
| PHOTOPOLYMERIZATION INITIATOR | Irgacure TPO (BASF) | 1.6 | 1.6 | 1.6 | 1.7 | 1.7 |
| UV-CURABLE RESIN | Blemmer LA (NOF) | 2.8 | | | | |
| | DPHA (Nippon Kayaku) | | 1.3 | 1.3 | | |
| | UX-5000 (Nippon Kayaku) | | | | 1.3 | |
| | DPHA-40H (Nippon Kayaku) | | | | | 0.7 |
| ADDITIVE A | BYK-361N (BYK) | 0.1 | 0.1 | 0.1 | 0.1 | 0.1 |
| ADDITIVE B | Lumogen F Violet 570 (BASF) | | | 0.7 | | |

TABLE 2-continued

| MATERIAL | MATERIAL NAME | AMOUNT ADDED (PARTS) | | | | |
|---|---|---|---|---|---|---|
| (TYPE) | (MANUFACTURER) | R2 | R3 | R4 | R5 | R6 |
| SOLVENT | Anisole | 38.6 | 38.6 | 38.6 | 38.6 | 38.6 |
|  | Methyl ethyl ketone | 25.8 | 25.9 | 25.8 | 25.8 | 25.6 |

"Blemmer LA": lauryl acrylate (Mw.240.4)
"DPHA": dipentaerythritol hexacrylate (Mw.578)
UX-5000: ester-based urethane acrylate resin (Mw.1,500)
DPHA-40H: urethane acrylate-based resin (Mw.2,000)
Additive A: polyacrylate-based surface modifier
Additive B: naphthalimide fluorescent dye An ultraviolet-curable resin and additives A, B shown in Table 2 are as follows.

<Evaluation of Light Reflecting Layer>

The central reflection wavelength, the half-width, the reflectance in the central reflection wavelength, the haze value of the obtained light reflecting layer, and a value b* indicating the tone of the transmissive color of the light reflecting layer were measured. The results are shown in Table 3. The haze value was measured by using a haze meter (TC-HIII, manufactured by Tokyo Denshoku CO., LTD.) in conformity to JIS K7105. The value b* was measured by using a color-difference meter (CM-2600d, manufactured by Konica Minolta, Inc.) in conformity to JIS Z8730:2009.

TABLE 3

|  | CENTRAL REFLECTION WAVELENGTH (nm) | HALF-WIDTH (nm) | REFLECTANCE (%) | HAZE VALUE (%) | VALUE b* |
|---|---|---|---|---|---|
| EXAMPLE 2 | 450 | 100 | 31 | 1.2 | 1.25 |
| EXAMPLE 3 | 440 | 100 | 30 | 1 | 1.38 |
| EXAMPLE 4 | 450 | 100 | 30 | 1.1 | 0.78 |
| EXAMPLE 5 | 450 | 100 | 30 | 1.3 | 0.65 |
| EXAMPLE 6 | 450 | 100 | 30 | 1.2 | 1.02 |

<Preparation of Liquid Crystal Display Device>

Liquid crystal display devices were prepared so as to have the configurations shown in FIG. 1 and FIG. 2. The array substrate 19 was prepared by disposing, on the glass substrate 23, the thin film transistors, the signal lines, the scanning lines, the color filter 22 provided with the wavelength conversion layer 22b containing quantum dots, the in-cell polarizer 21 held between the overcoat layers 20a, 20b, the common electrode, and the pixel electrodes. The color filter 22 provided with the wavelength conversion layer 22b containing the quantum dots was disposed on the signal lines via an insulating film. As the quantum dots, in accordance with the description of a technical literature: Journal of American Chemical Society 2007, 129, 15432-15433, with the peak wavelength of the excitation light being 450 nm, it is possible to prepare InP/ZnS core-shell type quantum dots in which the peak wavelength of the fluorescence spectrum is 637 nm and InP/ZnS core-shell type quantum dots in which the peak wavelength of the fluorescence spectrum is 528 nm. In the example, in accordance with the description of examples in Japanese Patent Application Publication No. 2017-21322, compositions each containing a mixture of each quantum-dot dispersion and a photosensitive resin were prepared, each composition was applied on a glass substrate by spin coating, followed by heating, and then irradiated with ultraviolet rays by using a photomask with a line/space pattern of 1 µm or more and 100 µm or less. Subsequently, by performing development with a developing solution and washing, the color filter 22 containing three colors of colorless, green, and red each as one pixel was obtained. In the prepared liquid crystal display device 1, the in-cell polarizer 21 held between the pair of overcoat layers 20a, 20b was disposed on the color filter 22 containing the quantum dots via an insulating film. Further, the common electrode was disposed on the overcoat layer 20a of the in-cell polarizer 21 via an insulating film, and the pixel electrode was further disposed on the common electrode via an insulating film. The common electrode and pixel electrode were formed of ITO (indium tin oxide) excellent in transparency and conductivity. The signal line and the scanning line intersected with each other and had the thin film transistor in the vicinity of the intersection to correspond one-to-one to the pixel electrode. A potential corresponding to an image signal from the signal line was imparted to the pixel electrode through the thin film transistor and a contact hole, and the operation of the thin film transistor was controlled by a scanning signal of the scanning line. The liquid crystal display device 1 was provided with a first alignment film (not shown) on the side adjacent to the liquid crystal layer 18 of the pixel electrode. The first alignment film was a polyimide polymer and oriented in a predetermined direction by optical orientation or rubbing treatment.

The counter substrate 17 was prepared by providing a columnar spacer and a second alignment film (not shown) on the side adjacent to the liquid crystal layer 18 of the glass substrate. The second alignment film was a polyimide polymer similarly to the first alignment film and was oriented in a predetermined direction by optical orientation or rubbing treatment. The array substrate 19 and the counter substrate 17 were assembled, and a gap therebetween was uniformly maintained by the columnar spacer disposed on the counter substrate 17. Liquid crystals were enclosed into this gap to prepare the liquid crystal layer 18.

The backlight-side polarizing plate 13 was disposed on the counter substrate 17 on the backlight unit 11 side. The backlight-side polarizing plate 13 and the counter substrate 17 were bonded by using an acrylic pressure-sensitive adhesive. At this time, the backlight-side polarizing plate 13 was disposed such that the absorption axis of the backlight-side polarizing plate 13 and the absorption axis of the in-cell polarizer 21 were orthogonal to each other. Further, the observer-side polarizing plate 15 was bonded to the observer side of the array substrate 19 by using the acrylic pressure-sensitive adhesive. Here, the observer-side polarizing plate 15 was disposed such that the absorption axis of the observer-side polarizing plate 15 and the absorption axis of the in-cell polarizer 21 were parallel to each other. Moreover, the laminate of the quarter-wave plate 24 and the light reflecting layer 16, having been disposed on the observer side of the observer-side polarizing plate 15 with the plastic substrate on the observer side, was laminated by using the acrylic pressure-sensitive adhesive such that the quarter-wave plate 24 was disposed between observer-side polarizing plate 15 and the light reflecting layer 16. Here, these plates were laminated such that the angle between the absorption axis of the observer-side polarizing plate 15 and the slow axis of the quarter-wave plate 24 was 45°.

For the backlight Unit 11, the same one was used as a commercially available liquid crystal display device using a blue LED (the peak wavelength during emission is about 450 nm) as the light source. The backlight unit 11 was an edge-light type, including a reflective plate below the light guide plate and the diffusion sheet and two prism sheets above the light guide plate. The respective stripe lines of the two prism sheets were orthogonal to each other. As described above, the liquid crystal display unit 12 and the backlight unit 11 were combined to prepare each of the liquid crystal display devices 1 of Examples 1 to 6.

<Evaluation of Display Image>

The prepared liquid crystal display device 1 of Example 1 was disposed on the window side in a room and the visibility of a display image was observed visually. In the liquid crystal display device 1 of Example 1, even when the sunlight is incident from the window in a direction inclined from the display surface of the liquid crystal display device 1 by about 30°, because an excitation wavelength contained in the sunlight was cut by the light reflecting layer 16, it was possible to reduce the emission by the external light performed by the color filter 22 that was provided with the wavelength conversion layer 22b containing the quantum dots. As a result, it was possible to significantly improve the visibility of the display image of the liquid crystal display device 1. Further, in the liquid crystal display device 1 prepared in each of Examples 2 to 6, because a tone of yellow transmitted through the light reflecting layer 16 is low, it was possible to reduce the emission by external light performed by the color filter 22 that was provided with the wavelength conversion layer 22b containing the quantum dots, and significantly reduce effects on the display colors of the display image.

Comparative Example

A liquid crystal image display device, similar to that of Example 1 except that the light reflecting layer 16 in FIG. 1 was not disposed, was prepared. The liquid crystal image display device was disposed on the window side in the room in the same manner as Example 1 and observed in the same manner. The color filter provided with the wavelength conversion layer containing the quantum dot was not able to reduce the emission by external light, and as a result, the visibility of the display image of the liquid crystal display device 1 deteriorated greatly.

From the above result, the image display device according to the present disclosure can achieve a display image excellent in visibility even in an environment with external light. In particular, the image display device according to the present disclosure can cut external light containing a wavelength of excitation light for quantum dots more effectively, and efficiently reflect only external light while maintaining the brightness of emitted light from the image display device.

What is claimed is:

1. An image display device comprising:
   a wavelength conversion layer containing quantum dots configured to emit light as a result of being irradiated with excitation light from a light source; and
   a polarizing plate;
   a quarter-wave plate; and
   a light reflecting layer including a reflection wavelength region configured to reflect a peak wavelength of said excitation light from said light source, in this order from said light source, wherein the light reflecting layer is a cholesteric liquid crystal layer.

2. The image display device according to claim 1, wherein the image display device is a liquid crystal display device or an organic electroluminescence (EL) display.

3. The image display device according to claim 1, wherein the wavelength conversion layer contains a first quantum dot that is excited by the excitation light to emit green light, and a second quantum dot that is excited by the excitation light to emit red light.

4. The image display device according to claim 1, wherein a peak wavelength of the light source is 350 nm or more and 650 nm or less.

5. The image display device according to claim 1, wherein a central reflection wavelength of the light reflecting layer is 350 nm or more and 750 nm or less.

6. The image display device according to claim 1, wherein an absolute value of a difference between the central reflection wavelength of the light reflecting layer and the peak wavelength of the light source is 0 nm or more and 70 nm or less.

7. The image display device according to claim 1, wherein a phase-difference value of the quarter-wave plate is 90 nm or more and 125 nm or less.

8. The image display device according to claim 1, wherein an angle between a slow axis of the quarter-wave plate and a polarization axis of the polarizing plate is 45°.

9. The image display device according to claim 1, wherein an anti-reflective layer is further provided on the observer side of the light reflecting layer.

* * * * *

UNITED STATES PATENT AND TRADEMARK OFFICE
CERTIFICATE OF CORRECTION

PATENT NO. : 11,042,058 B2
APPLICATION NO. : 16/550783
DATED : June 22, 2021
INVENTOR(S) : Kouichi Tanaka It is certified that error appears in the above-identified patent and that said Letters Patent is hereby corrected as shown below:

In the Specification

Column 5 Line 55, "such as AN, AlP, AiAs," should read -- such as AlN, AlP, AiAs --

Signed and Sealed this
Eighth Day of March, 2022

Drew Hirshfeld
*Performing the Functions and Duties of the*
*Under Secretary of Commerce for Intellectual Property and*
*Director of the United States Patent and Trademark Office*